US010462945B2

(12) United States Patent
Mantani et al.

(10) Patent No.: US 10,462,945 B2
(45) Date of Patent: *Oct. 29, 2019

(54) SYSTEM FOR MANUFACTURING ASSEMBLY BOARD AND METHOD FOR INSTALLING UNDERSUPPORTING DEVICE OF THE SYSTEM

(71) Applicant: PANASONIC INTELLECTUAL PROPERTY MANAGEMENT CO., LTD., Osaka (JP)

(72) Inventors: Masayuki Mantani, Yamanashi (JP); Takaaki Sakaue, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 110 days.

This patent is subject to a terminal disclaimer.

(21) Appl. No.: 15/373,909

(22) Filed: Dec. 9, 2016

(65) Prior Publication Data

US 2017/0245405 A1  Aug. 24, 2017

(30) Foreign Application Priority Data

Feb. 18, 2016 (JP) .................. 2016-028459
Feb. 18, 2016 (JP) .................. 2016-028461

(51) Int. Cl.
*H05K 13/00* (2006.01)
*B25B 11/00* (2006.01)
(Continued)

(52) U.S. Cl.
CPC .......... *H05K 13/0069* (2013.01); *B23P 19/04* (2013.01); *B25B 11/002* (2013.01);
(Continued)

(58) Field of Classification Search
CPC ... H05K 2203/0147; H05K 2203/0152; H05K 2203/0165; H05K 2203/0173;
(Continued)

(56) References Cited

U.S. PATENT DOCUMENTS

2013/0020379 A1* 1/2013 Kim .................. H05K 3/1233
228/256
2015/0075721 A1 3/2015 Mantani et al.
(Continued)

FOREIGN PATENT DOCUMENTS

JP  H03-289198 A  12/1991
JP  H07-186362 A  7/1995
(Continued)

*Primary Examiner* — Matthew P Travers
(74) *Attorney, Agent, or Firm* — Pearne & Gordon LLP

(57) ABSTRACT

A system for manufacturing an assembly board includes an undersupporting device, a transporter configured to transport a board and the undersupporting device, an undersupporting-device installer provided below the transporter, the undersupporting-device installer being attachable to and detachable from the undersupporting device, a board processor configured to perform a predetermined processing to an upper surface of the board, a carry-in side delivering unit having first and second receiving positions different from each other, a board supplier configured to supply the board to the first receiving position, and an undersupporting-device supplier configured to supply the undersupporting device to the second receiving position. The transporter transports, to the carry-in side delivering unit, the undersupporting device detached from the undersupporting-device installer. The carry-in side delivering unit positions, at the second receiving position, the undersupporting device delivered from the transporter to allow the undersupporting device to be carried out from the second receiving position.

14 Claims, 16 Drawing Sheets

(51) Int. Cl.
*B41F 15/18* (2006.01)
*B23P 19/04* (2006.01)
*B41F 15/26* (2006.01)
*H05K 3/30* (2006.01)
*H05K 13/04* (2006.01)
*H05K 3/12* (2006.01)

(52) U.S. Cl.
CPC ............ *B25B 11/005* (2013.01); *B41F 15/18* (2013.01); *H05K 3/30* (2013.01); *H05K 13/0465* (2013.01); *B41F 15/26* (2013.01); *B65G 2201/0261* (2013.01); *H05K 3/1216* (2013.01); *H05K 2203/0165* (2013.01)

(58) Field of Classification Search
CPC ....... H05K 2203/1509; H05K 13/0069; H05K 13/046; H05K 13/0469; H05K 3/1216; H05K 13/04; H05K 13/0465; H05K 3/30–301; B41F 15/0818; B41F 15/0881; B41F 15/18; B41F 15/26; Y10T 29/53196; Y10T 29/53191; Y10T 29/53265; Y10T 29/49829; Y10T 29/53313; Y10T 29/53365; Y10T 29/5337; Y10T 29/53539–53548; Y10T 29/49002; Y10T 29/49885; Y10T 29/49998; Y10T 29/53174–53183; B23P 21/004; B23P 19/04; B25B 11/002; B25B 11/005

See application file for complete search history.

(56) References Cited

U.S. PATENT DOCUMENTS

2015/0321464 A1 11/2015 Horie et al.
2016/0007512 A1* 1/2016 Higashi .............. H05K 13/0061
29/832

FOREIGN PATENT DOCUMENTS

| JP | 2000-124690 A | | 4/2000 | |
|---|---|---|---|---|
| JP | 3499759 B2 | | 2/2004 | |
| JP | 2008166583 A | * | 7/2008 | ............ H05K 13/04 |
| JP | 2015-083364 A | | 4/2015 | |
| JP | 2015-214089 A | | 12/2015 | |

* cited by examiner

SYSTEM FOR MANUFACTURING ASSEMBLY BOARD AND METHOD FOR INSTALLING UNDERSUPPORTING DEVICE OF THE SYSTEM

BACKGROUND

1. Technical Field

The present disclosure relates to an assembly board manufacturing system which performs predetermined processing, such as screen printing or mounting components, with respect to a board, and an installation method of an undersupporting device in the assembly board manufacturing system.

2. Description of the Related Art

In the related art, in an assembly board manufacturing system which performs predetermined processing, such as screen printing or mounting components, with respect to a board, in order to stably perform the processing to the board, a lower surface of the board which becomes a processing target is supported. An undersupporting device which is used in supporting the board has a shape or a size that varies in accordance with the size of the board or a state (for example, a disposition state of components which have already been mounted on the lower surface of the board) of the lower surface, and when changing the type of the board to be produced, preparatory work of exchanging the undersupporting device in accordance with the board that becomes the processing target is required. Most of the preparatory work of exchanging the undersupporting device is performed manually, and causes an increase in the number of processes. Therefore, a system which prepares a plurality of undersupporting devices which correspond to the type of the board in advance, and automatically changes the undersupporting devices in accordance with the board which becomes the processing target, is known. For example, in Japanese Patent No. 3499759, a system which supplies a carrier that can hold an undersupporting device into a transporter, and supplies and collects the undersupporting device through the supplied carrier, is disclosed.

SUMMARY

A system for manufacturing an assembly board includes an undersupporting device, a transporter configured to transport a board and the undersupporting device, an undersupporting-device installer provided below the transporter, the undersupporting-device installer being attachable to and detachable from the undersupporting device, a board processor configured to perform a predetermined processing to an upper surface of the board, a carry-in side delivering unit having first and second receiving positions different from each other, a board supplier configured to supply the board to the first receiving position, and an undersupporting-device supplier configured to supply the undersupporting device to the second receiving position. The carry-in side delivering unit delivers, to the transporter, the undersupporting device supplied to the second receiving position. The transporter transports, to a working position, the undersupporting device delivered from the carry-in side delivering unit. The undersupporting-device installer fixes, to the undersupporting-device installer, the undersupporting device transported to the working position. The carry-in side delivering unit delivers, to the transporter, the board supplied to the first receiving position. The transporter transports, to the working position, the board delivered from the carry-in side delivering unit. The undersupporting device supports a lower surface of the board transported to the working position. The board processor performs the predetermined processing to the upper surface of the board while the undersupporting device is installed to the undersupporting-device installer and the undersupporting device supports the lower surface of the board. The transporter transports, to the carry-in side delivering unit, the undersupporting device detached from the undersupporting-device installer. The carry-in side delivering unit positions, at the second receiving position, the undersupporting device delivered from the transporter to allow the undersupporting device to be carried out from the second receiving position.

The system can install the undersupporting device without interrupting the supplying of the board.

DETAILED DESCRIPTION OF THE PREFERRED EMBODIMENTS

In a device described in Japanese Patent No. 3499759, a carrier is sent to a transporter by a path which is completely the same as that of a board, therefor in order to supply an undersupporting device to be automatically installed into the transporter to automatically install the undersupporting device, it is necessary to temporarily stop the supply of a board by a board supplier. Therefore, processing work with respect to the board is interrupted, and there is a concern that productivity of the board deteriorates.

Figure 1:
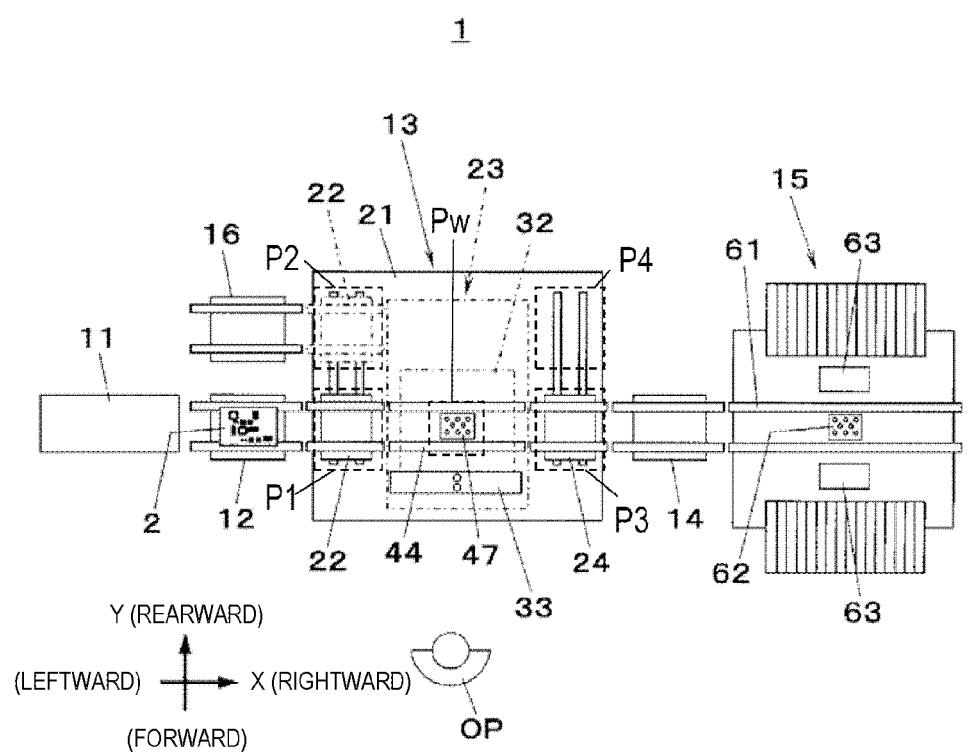
FIG. 1 is a plan view illustrating a schematic configuration of an assembly board manufacturing system in an embodiment.

Hereinafter, an embodiment of this disclosure will be described with reference to the drawings. FIG. 1 illustrates assembly board manufacturing system 1 in the embodiment. Assembly board manufacturing system 1 performs screen printing processing and mounting processing of a component with respect to board 2, manufactures an assembly board, and includes board supplier 11, carry-in side relay conveyor 12, screen printing device 13, carry-out side relay conveyor 14, component placement device 15, and undersupporting device stocker (undersupporting-device supplier) 16. A flow of board 2 is in the direction from a left side to a right side when viewed from operator OP, and the direction is the X-axis direction. In addition, the forward-and-rearward direction when viewed from operator OP is considered as the Y-axis direction, and the upward-and-downward direction is considered as the Z-axis direction.

Board supplier 11 is provided on the most upstream process side of assembly board manufacturing system 1, and continuously supplies board 2. Carry-in side relay conveyor 12 is provided on a downstream process side of board supplier 11, and transports board 2 supplied by board supplier 11 to screen printing device 13 on the downstream process side.

As illustrated in FIG. 1, screen printing device 13 is provided with carry-in side delivering unit 22, printing performer 23, and carry-out side delivering unit 24 on base 21. Printing performer 23 is provided at the center of base 21, and carry-in side delivering unit 22 is provided in a region (upstream process side of printing performer 23) on a left side of printing performer 23 on base 21. In addition, carry-out side delivering unit 24 is provided in a region (downstream process side of printing performer 23) on a right side of printing performer 23 on base 21.

In FIG. 1, carry-in side delivering unit 22 receives a transport target supplied from the upstream process side at any of a plurality of receiving positions which are set to be aligned in the Y-axis direction, and delivers the received transport target to a transporter inlet on the left end side of printing performer 23 (specifically, transporter 44 which will be described later). In the embodiment, the receiving positions at which carry-in side delivering unit 22 receives the transport target are two positions, including receiving position P1 (illustrated by a broken line in FIG. 1) close to operator OP side, and receiving position P2 (illustrated by a broken line in FIG. 1) far from operator OP side, and receiving position P1 matches the transporter inlet.

Board supplier 11 supplies board 2 to receiving position P1 via carry-in side relay conveyor 12. Therefore, in a case where carry-in side delivering unit 22 receives the transport target (here, board 2) at receiving position P1, board 2 is positioned at the transporter inlet while maintaining a state thereof. In other words, in the embodiment, board supplier 11 supplies board 2 which serves as a transport target to receiving position P1 among the plurality of receiving positions provided in carry-in side delivering unit 22.

Figure 2:
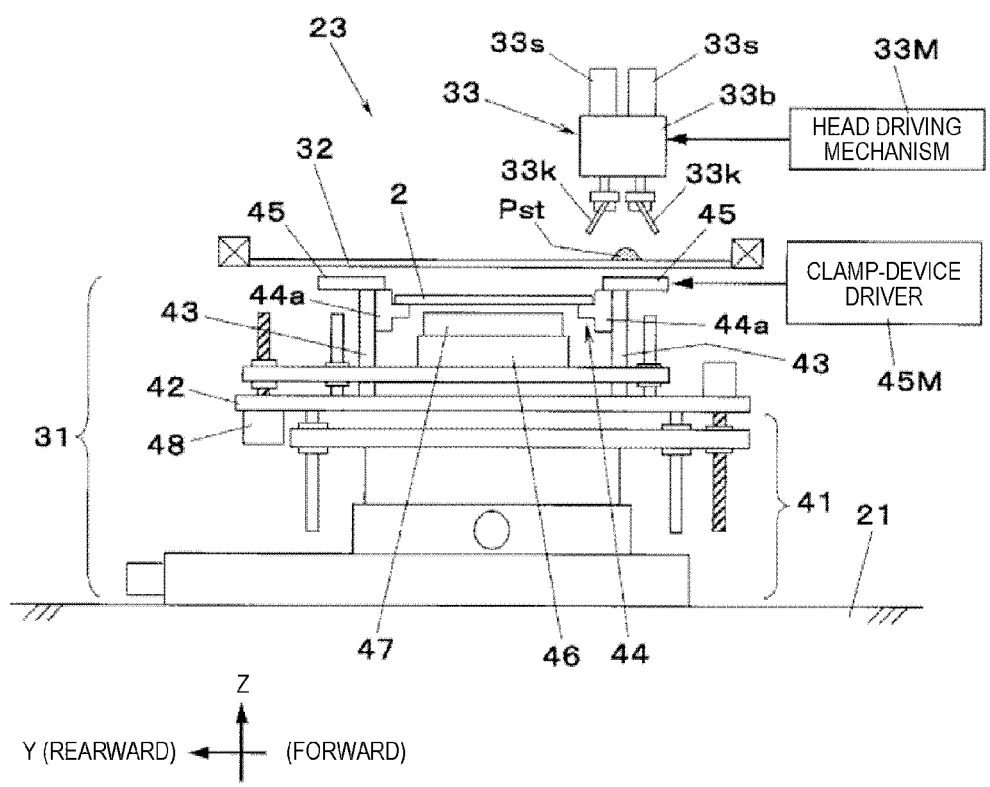
FIG. 2 is a side view of a screen printing device provided in the assembly board manufacturing system in the embodiment.

In FIG. 2, printing performer 23 is provided with board holding unit 31 provided on base 21, mask 32, and squeegee head 33. Board holding unit 31 is provided with XYZ rotation stage 41 provided on base 21; base part 42 which freely moves on a horizontal plane by XYZ rotation stage 41, moves to be raised and lowered, and rotates around the Z-axis; transporter 44 and one pair of clamp devices 45 which are attached to one pair of transporter support walls 43 provided in base part 42; undersupporting-device installer 46 which is provided below transporter 44; undersupporting device 47 which is installed to be freely attached to and detached from an upper surface of undersupporting-device installer 46; and an elevator mechanism 48 (undersupporting-device installer elevator mechanism) which raises and lowers undersupporting-device installer 46 (that is, undersupporting device 47) with respect to base part 42. Mask 32 and squeegee head 33 configure a board processor which performs predetermined processing to the upper surface of board 2 of which the lower surface is supported by undersupporting device 47.

In FIG. 2, transporter 44 includes one pair of conveyors 44a which are installed to oppose each other in the Y-axis direction. One pair of clamp devices 45 are driven by a clamp-device driver 45M, and are operated to approach or be separated from each other. Transporter 44 receives and transports the transport target which is positioned at the transporter inlet (receiving position P1) by carry-in side delivering unit 22, positions the transport target to predetermined working position Pw, and carries out the transport target.

Figure 3:
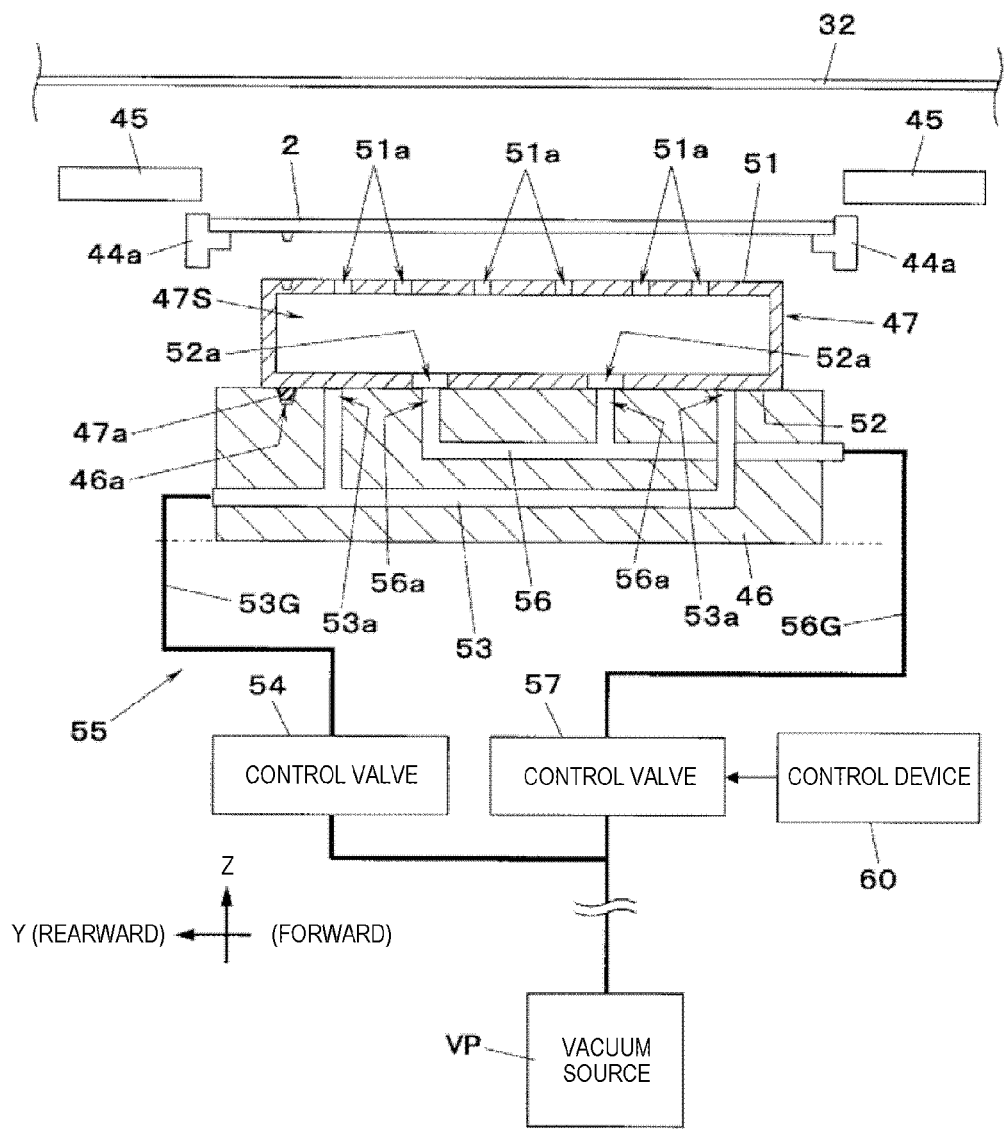
FIG. 3 is a side sectional view of the vicinity of an undersupporting device of the screen printing device provided in the assembly board manufacturing system in the embodiment.

As illustrated in FIGS. 2 and 3, mask 32 is held to be in a horizontal posture above board holding unit 31. Mask 32 is configured of, for example, a metal plate-like device, and at the center thereof, pattern openings (not illustrated) which correspond to each of plural electrodes (not illustrated) formed on the upper surface of board 2, are provided. Squeegee head 33 is configured to include two squeegees 33k which are provided to oppose each other in the Y-axis direction on squeegee base 33b which is driven by head driving mechanism 33M and moves in the Y-axis direction above mask 32; and two cylinders 33s which raise and lower each squeegee 33k with respect to squeegee base 33b.

Figure 4:
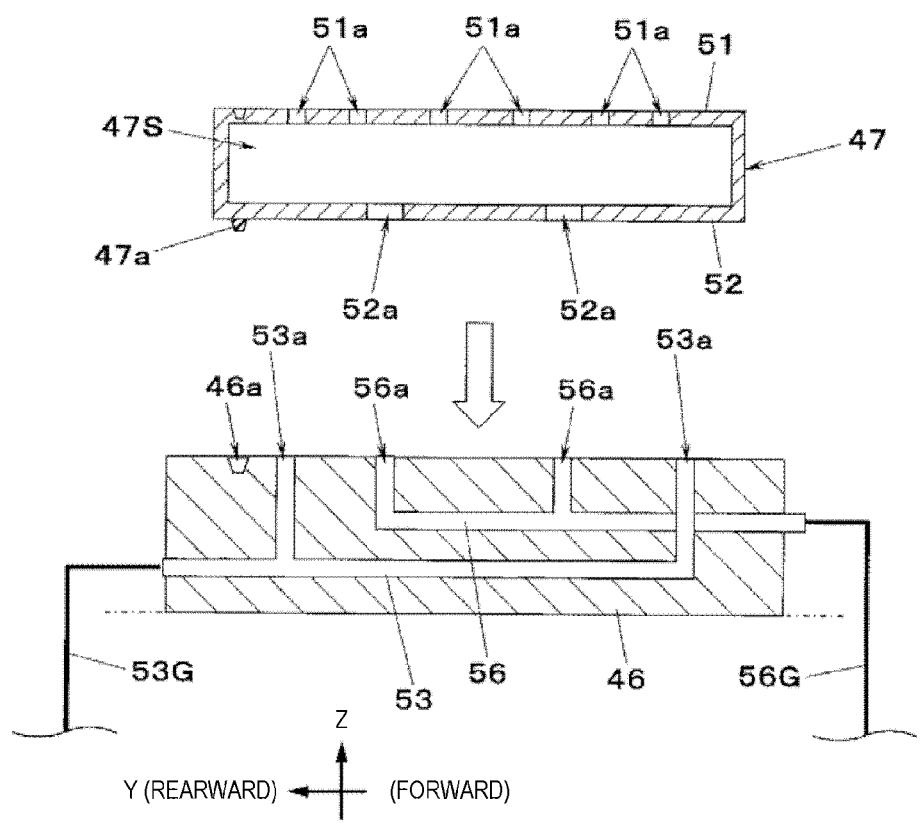
FIG. 4 is a side sectional view illustrating the undersupporting device of the screen printing device provided in the assembly board manufacturing system in the embodiment, together with an undersupporting-device installer.

Undersupporting device 47 is a hollow box-like device which has inner space 47S as illustrated in FIGS. 3 and 4—and is mad of a magnetic material. Undersupporting device 47 is a device which supports the lower surface of board 2 that serves as a transport target positioned at working position Pw by transporter 44, and in the embodiment, undersupporting device 47 is configured to suction the lower surface while supporting the lower surface of board 2 positioned at working position Pw by transporter 44.

The upper surface of top board 51 of undersupporting device 47 is a surface which comes into contact with the lower surface of board 2, and is provided with a plurality of suction holes 51a which are open at the upper part thereof. The lower surface of bottom board 52 of undersupporting device 47 is a surface which comes into contact with the upper surface of undersupporting-device installer 46, and is provided with a plurality of piping connection holes 52a which are open at the lower part thereof.

In FIGS. 3 and 4, vacuum suction piping 53 is formed on the inside of undersupporting-device installer 46, and vacuum suction opening 53a which is an outlet of vacuum suction piping 53 is formed on the upper surface of undersupporting-device installer 46. When undersupporting device 47 is installed on undersupporting-device installer 46, vacuum suction opening 53a is sealed by bottom plate 52 of undersupporting device 47 (FIG. 4).

In FIG. 3, vacuum suction piping 53 is linked to vacuum source VP through outer piping 53G which extends on the outside of undersupporting-device installer 46, and control valve 54 is interposed in outer piping 53G. When vacuum source VP suctions out the air through outer piping 53G and vacuum suction piping 53 in a state where undersupporting device 47 is installed on undersupporting-device installer 46, undersupporting device 47 is fixed to undersupporting-device installer 46 by a vacuum-suctioning force to be generated in vacuum suction opening 53a. By adjusting the size of the vacuum-suctioning force to be generated to vacuum suction opening 53a by driving control valve 54, it is possible to adjust a holding force of undersupporting device 47. Additionally, it is possible to release a fixed state of undersupporting device 47 to undersupporting-device installer 46 by opening vacuum suction piping 53 to the atmosphere by driving control valve 54. In other words, in the embodiment, vacuum suction piping 53, outer piping 53G, and control valve 54 configure vacuum suction mechanism 55 which vacuum-suctions undersupporting device 47 to the undersupporting-device installer 46 side.

As illustrated in FIG. 4, projection 47a which protrudes downward is provided on the lower surface of undersupporting device 47, and recess 46a having a shape that can be fitted to projection 47a is provided on the upper surface of undersupporting-device installer 46. Plural projections 47a and recesses 46a are respectively provided to be aligned in the X-axis direction (the direction perpendicular to a paper surface of FIG. 4), and as the plurality of projections 47a of undersupporting device 47 are fitted to the plurality of recesses 46a of undersupporting-device installer 46, undersupporting device 47 is disposed in undersupporting-device installer 46 in a state of being accurately positioned on undersupporting-device installer 46.

It is preferable that projection 47a is conical, and in this manner, when undersupporting device 47 is installed above undersupporting-device installer 46, even when the center axis of each projection 47a is slightly shifted from the center axis of corresponding recess 46a, it is possible to install undersupporting device 47 at an accurate position on undersupporting-device installer 46. In addition, here, projection 47a is provided on the lower surface of undersupporting device 47, and recess 46a is provided on the upper surface of undersupporting-device installer 46, but the recess may be provided on the lower surface of undersupporting device 47, and the projection may be provided on the upper surface of undersupporting-device installer 46. In other words, in a state where the projection provided in any one of undersupporting device 47 and undersupporting-device installer 46, is fitted to the recess provided in the other one of undersupporting device 47 and undersupporting-device installer 46, undersupporting device 47 may be installed on undersupporting-device installer 46.

In FIGS. 3 and 4, suction piping 56 is formed on the inside of undersupporting-device installer 46, and outlet opening 56a of suction piping 56 is formed on the upper surface of undersupporting-device installer 46. When undersupporting device 47 is installed on undersupporting-device installer 46, outlet opening 56a of suction piping 56 matches piping connection hole 52a provided on bottom board 52 of undersupporting device 47, and inner space 47S of undersupporting device 47 and suction piping 56 are connected to each other (FIG. 4)

In FIG. 3, suction piping 56 is linked to vacuum source VP through outer piping 56G which extends on the outside of undersupporting-device installer 46, and control valve 57 is interposed in outer piping 56G. When vacuum source VP suctions out the air through outer piping 56G and suction piping 56 in a state where board 2 is in contact with undersupporting device 47, board 2 is suctioned to undersupporting device 47 by a suctioning force generated in suction hole 51a. Accordingly, it is possible to adjust a holding force of board 2 by driving control valve 57 and adjusting the size of the suctioning force generated in suction hole 51a, and also it is possible to release the suctioned state of board 2 to undersupporting device 47 by driving control valve 57 and opening suction piping 56 to the atmosphere.

In FIG. 1, when carrying out the transport target, transporter 44 carries out the transport target from the transporter outlet on the right side, and carry-out side delivering unit 24 receives the transport target carried out from transporter 44 in a state of being moved to the transporter outlet. In addition, carry-out side delivering unit 24 carries out the transport target received from transporter 44, to the outside from any of the plurality of carry-out positions set to be aligned in the Y-axis direction. In the embodiment, the carry-out positions are two positions, including carry-out position P3 (illustrated by a broken line in FIG. 1) close to operator OP side, and carry-out position P4 (illustrated by a broken line in FIG. 1) far from operator OP side, and carry-out position P3 matches the transporter outlet. Therefore, when carry-out side delivering unit 24 receives the transport target at the transporter outlet, the transport target is positioned at carry-out position P3 while maintaining a state thereof.

Figure 5:
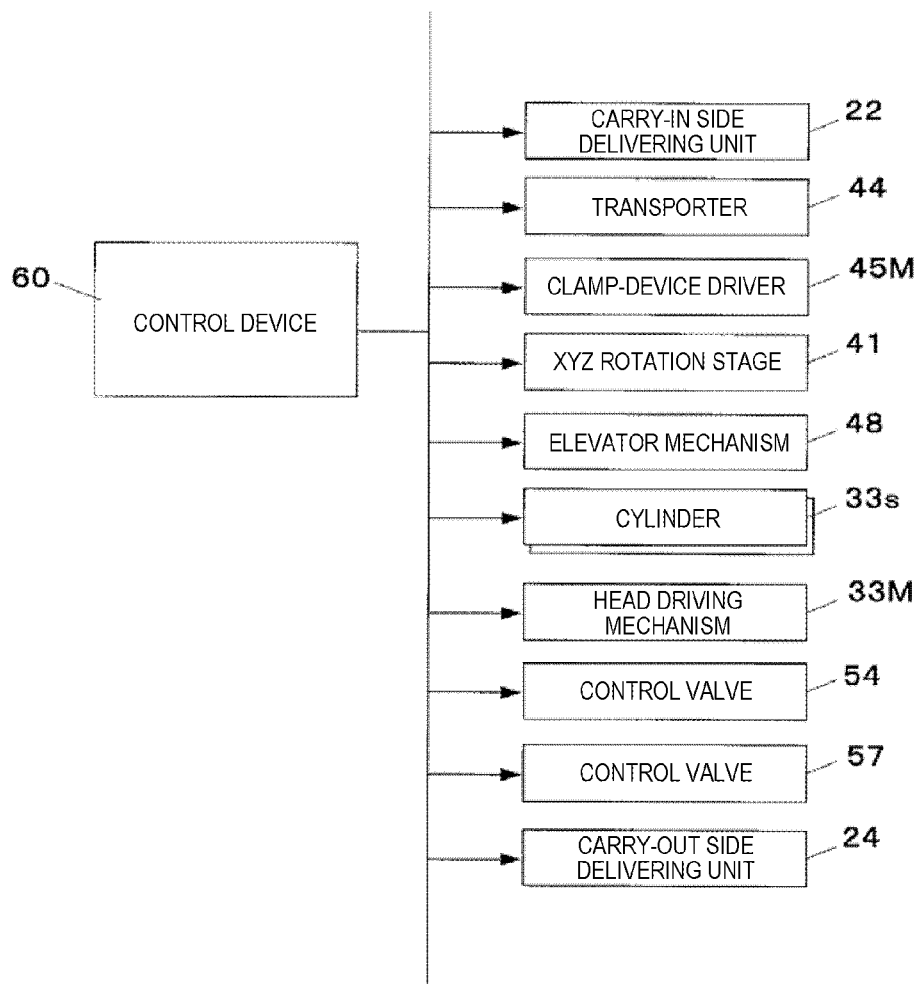
FIG. 5 is a block diagram illustrating an operation system of the screen printing device provided in the assembly board manufacturing system in the embodiment.

In screen printing device 13 having the above-described configuration, operation control of carry-in side delivering unit 22, operation control of transporter 44, operation control of clamp-device driver 45M, movement control of base part 42 by XYZ rotation stage 41, raising and lowering operation control of base part 42 by elevator mechanism 48, raising and lowering operation control of squeegee 33k by cylinder 33s, movement control of squeegee head 33 by head driving mechanism 33M, and operation control of carry-out side delivering unit 24, are performed by control device 60 provided in screen printing device 13 (FIG. 5). In addition, control device 60 also performs driving control of control valve 54 (that is, vacuum suction mechanism 55) and control valve 57 (refer to FIG. 3).

In FIG. 1, carry-out side relay conveyor 14 is provided on the downstream process side of screen printing device 13. Carry-out side relay conveyor 14 receives the transport target carried out by carry-out side delivering unit 24 of screen printing device 13 from carry-out position P3 to the outside, and carries out the transport target to component placement device 15 on the downstream process side.

In FIG. 1, component placement device 15 transports board 2 sent from carry-out side relay conveyor 14 by board transport path 61, positions board 2 at working position Pw, and supports board 2 by board support unit 62 positioned below board transport path 61. In addition, components (not illustrated) are mounted on the electrode of board 2 to which the screen printing is performed in screen printing device 13, by mounting head 63.

In FIG. 1, undersupporting-device stocker 16 is provided on the upstream process side of screen printing device 13 being aligned with carry-in side relay conveyor 12 in the Y-axis direction. Undersupporting-device stocker 16 supplies undersupporting device 47 which is installed on undersupporting-device installer 46 of screen printing device 13, as the transport target. In the embodiment, undersupporting-device stocker 16 supplies undersupporting device 47 which serves as the transport target, to receiving position P2 provided in screen printing device 13. In addition, after receiving undersupporting device 47 at receiving position P2, carry-in side delivering unit 22 moves to the transporter inlet, and delivers undersupporting device 47 to transporter 44. In this manner, in the embodiment, undersupporting-device stocker 16 which is an undersupporting-device supplier supplies undersupporting device 47 which serves as the transport target to receiving position P2 that is different from receiving position P1 among the plurality of receiving positions provided in carry-in side delivering unit 22.

In addition, carry-in side delivering unit 22 moves to receiving position P2 in a case where carry-in side delivering unit 22 receives undersupporting device 47 installed on undersupporting-device installer 46 from transporter 44 at the transporter inlet (receiving position P1), and delivers undersupporting device 47 received from transporter 44 to undersupporting-device stocker 16. In addition, undersupporting-device stocker 16 collects and accommodates undersupporting device 47 received from carry-in side delivering unit 22. Undersupporting-device stocker 16 is configured to include, for example, a magazine which can stock a plurality of undersupporting devices 47 before installing undersupporting devices 47 to undersupporting-device installer 46, and has a plurality of accommodation spaces which can accommodate collected undersupporting devices 47 to be aligned in the upward-and-downward direction.

Figure 6A:
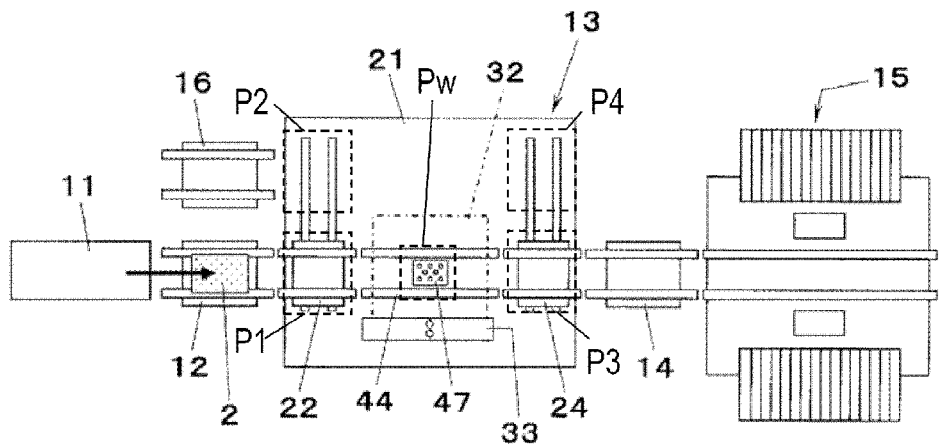
FIGS. 6A to 6C are views illustrating operations when screen printing work is performed by the assembly board manufacturing system in the embodiment.
Figure 6B:
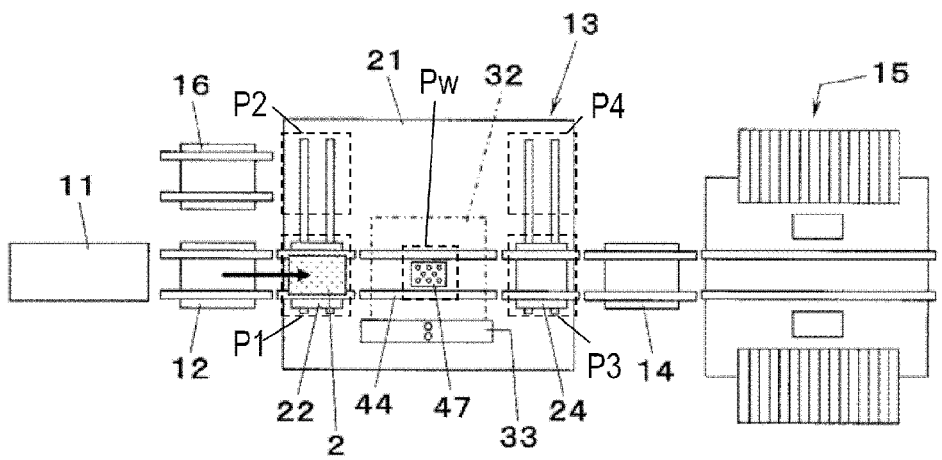
Figure 6C:
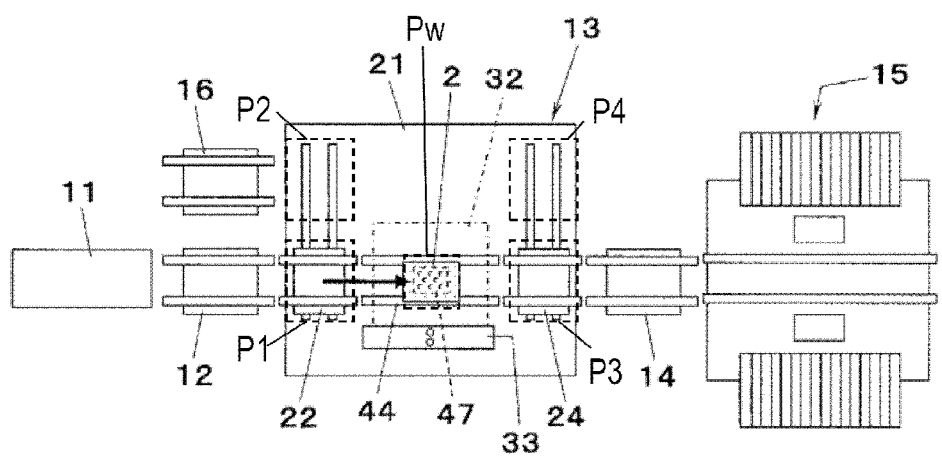
Figure 7A:
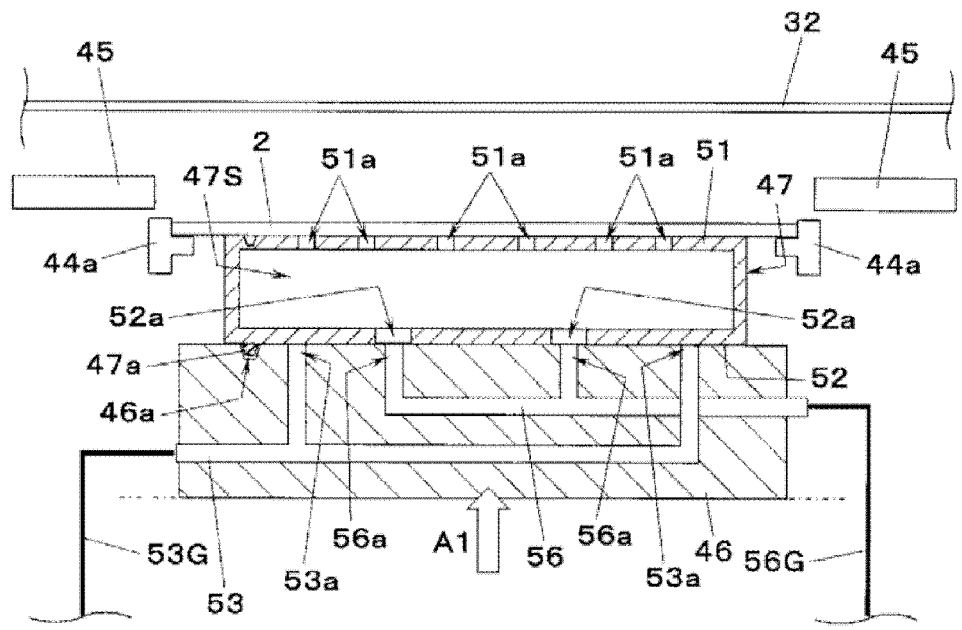
FIGS. 7A and 7B are views illustrating operations when the screen printing work is performed by the assembly board manufacturing system in the embodiment.

Next, an operation when manufacturing an assembly board by assembly board manufacturing system 1, will be described. In manufacturing the assembly board, first, board supplier 11 supplies board 2 to carry-in side relay conveyor 12 (FIG. 6A). Carry-in side relay conveyor 12 which receives board 2 from board supplier 11 delivers board 2 to carry-in side delivering unit 22 which is positioned in the transporter inlet (receiving position P1) in advance (FIG. 6B). Carry-in side delivering unit 22 which has received board 2 in the transporter inlet carries out board 2 to transporter 44 while maintaining a state thereof, and transporter 44 transports received board 2 to working position Pw (FIG. 6C). When board 2 is transported to working position Pw, elevator mechanism 48 raises undersupporting-device installer 46 (arrow A1 illustrated in FIG. 7A), and the upper surface of undersupporting device 47 is brought into contact with the lower surface of board 2 (FIG. 7A).

When the upper surface of undersupporting device 47 comes into contact with the lower surface of board 2, control device 60 operates control valve 57, and generates the suctioning force to suction hole 51a. Accordingly, board 2 tightly adheres to the upper surface of undersupporting device 47, and even in a case where deformation, such as a warp, is generated in board 2, board 2 is supported by undersupporting device 47 in a state where the deformation is corrected.

Figure 7B:
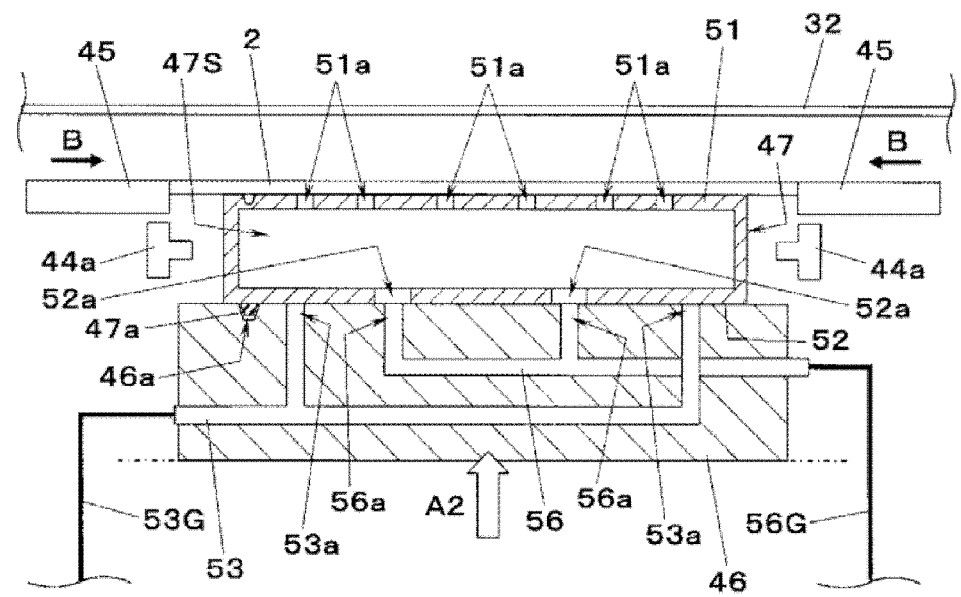

When board 2 is supported by undersupporting device 47, elevator mechanism 48 further raises undersupporting-device installer 46 (arrow A2 illustrated in FIG. 7B). Accordingly, board 2 is lifted up by undersupporting device 47, and is separated from transporter 44 (FIG. 7B). When board 2 is lifted up and the upper surface thereof is raised to have the same height as that of the upper surface of one pair of clamp devices 45, one pair of clamp devices 45 driven by clamp-device driver 45M operates to approach each other, and clamps board 2 from both end sides in the Y-axis direction (arrow B illustrated in FIG. 7B).

Figure 8:
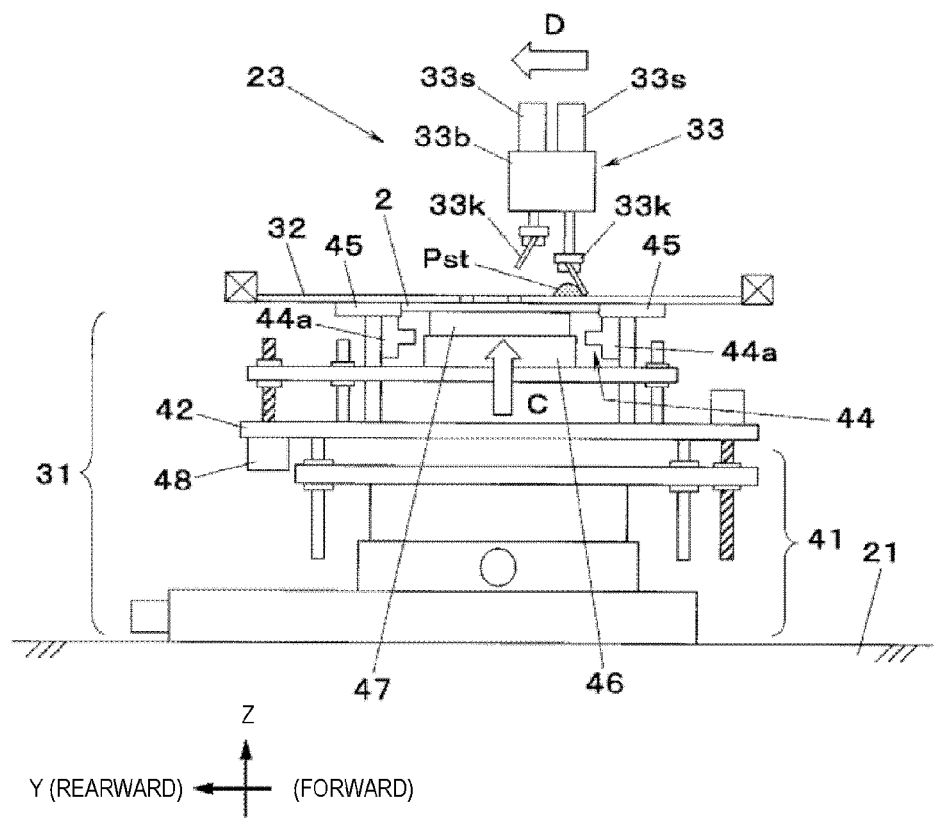
FIG. 8 is a view illustrating operations when the screen printing work is performed by the assembly board manufacturing system in the embodiment.
Figure 9A:
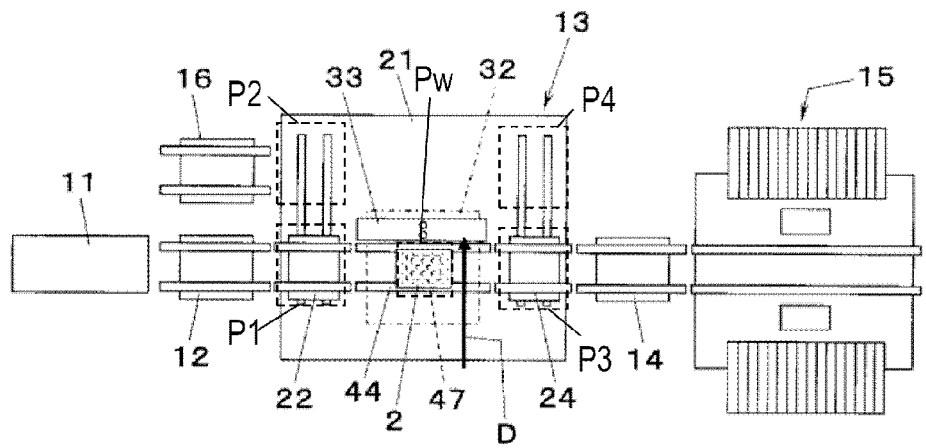
FIGS. 9A to 9C are views illustrating operations when the screen printing work is performed by the assembly board manufacturing system in the embodiment.

When one pair of clamp devices 45 clamps board 2, XYZ rotation stage 41 operates, board 2 is horizontally moved such that the pattern opening of mask 32 and the electrode of board 2 vertically match each other, and then, base part 42 is raised (arrow C illustrated in FIG. 8). Accordingly, when the upper surface of board 2 comes into contact with the lower surface of mask 32, squeegee head 33 lowers one squeegee 33k by cylinder 33s, and allows the lower end of squeegee 33k to abut against the upper surface of mask 32 (FIG. 8). When the lower end of squeegee 33k abuts against the upper surface of mask 32, head driving mechanism 33M operates, moves squeegee head 33 in the Y-axis direction (arrow D illustrated in FIGS. 8 and 9A), and slidely moves squeegee 33k on mask 32. Accordingly, paste Pst which has been supplied in advance onto mask 32 is scraped by squeegee 33k, and paste Pst is printed on the electrode of board 2 through the opening of mask 32.

Figure 9B:
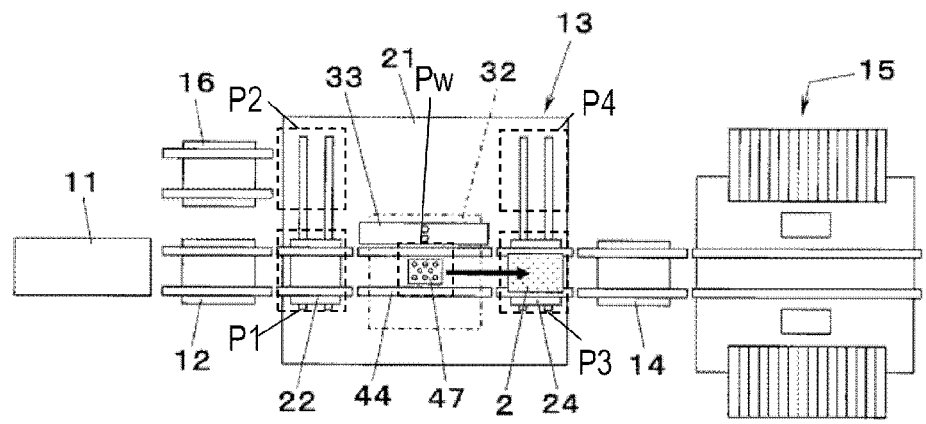
Figure 9C:
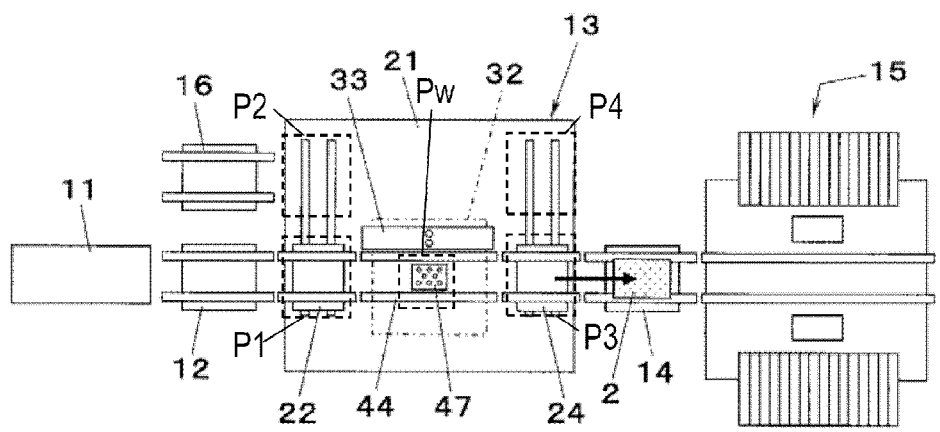

When paste Pst is printed on the electrode of board 2, XYZ rotation stage 41 operates, base part 42 is lowered, and board 2 is separated (plate releasing) from mask 32. When board 2 is separated from mask 32, control device 60 operates control valve 57 and releases the suctioned state of board 2. When the suctioned state of board 2 is released, one pair of clamp devices 45 operate in the direction in which clamp devices 45 are separated from each other and releases the clamp of board 2, and elevator mechanism 48 lowers undersupporting-device installer 46 and loads board 2 on transporter 44 (FIG. 3). When board 2 is loaded on transporter 44, transporter 44 transports board 2, and carries out board 2 to carry-out side delivering unit 24 which is positioned at the transporter outlet (carry-out position P3) in advance (FIG. 9B). Carry-out side delivering unit 24 receives board 2 (board 2 to which the screen printing is performed) carried out by transporter 44 at the transporter outlet, and carries out board 2 to carry-out side relay conveyor 14 while maintaining a state thereof (FIG. 9C). Accordingly, the screen printing for one board 2 is finished by screen printing device 13.

Carry-out side relay conveyor 14 carries out board 2 received from screen printing device 13 to component placement device 15. Component placement device 15 receives board 2 carried out by carry-out side relay conveyor 14, by board transport path 61, and positions board 2 at working position Pw, and after board 2 is supported by board support unit 62, the components are mounted on board 2 by mounting head 63. In addition, when all of the components to be mounted on board 2 are mounted, board 2 is carried out to the outside (downstream process side).

In assembly board manufacturing system 1 having the configuration, installation and detachment of undersupporting device 47 provided in screen printing device 13 can be respectively automatically performed, and the order thereof will be described hereinafter.

In a case of automatically installing undersupporting device 47 on undersupporting-device installer 46 of screen printing device 13, carrier 71 (FIGS. 10A and 10B) which is formed in a shape of a board, is used. A plurality of magnets 71M are provided on the lower surface of carrier 71 to be exposed downward. As described above, since undersupporting device 47 is configured of a magnetic material, and magnet 71M pulls undersupporting device 47 by the magnetic force, when the upper surface of undersupporting device 47 comes into contact with the lower surface of carrier 71, and undersupporting device 47 is held by carrier 71. In other words, in the embodiment, undersupporting device 47 is held on the lower surface of carrier 71 by the magnetic force between undersupporting device 47 and carrier 71.

Figure 10A:
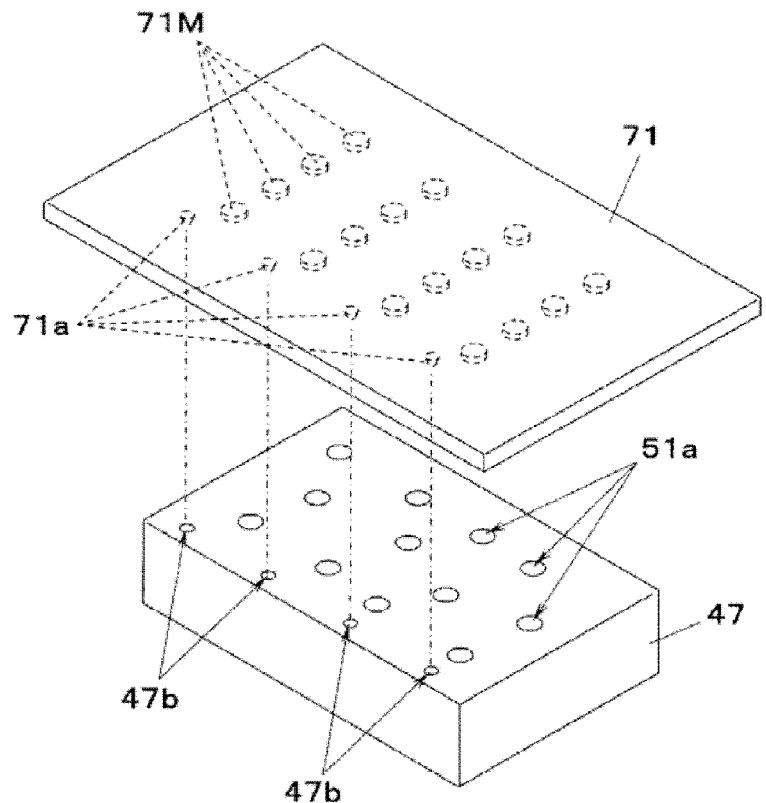
FIGS. 10A and 10B are perspective views illustrating the undersupporting device of the screen printing device provided in the assembly board manufacturing system in the embodiment, together with a carrier.
Figure 10B:
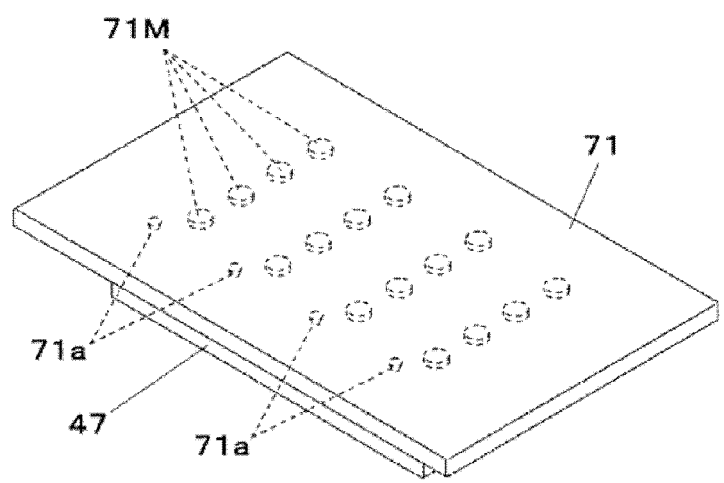

As illustrated in FIGS. 10A and 10B, a plurality of projections 71a which protrude downward are provided on the lower surface of carrier 71, and a plurality of holes 47b having a shape which can be fitted to each projection 71a are provided on the upper surface of undersupporting device 47. As the plurality of projections 71a of carrier 71 are fitted to the plurality of holes 47b of undersupporting device 47, undersupporting device 47 is accurately held at a predetermined holding position with respect to carrier 71.

Figure 11A:
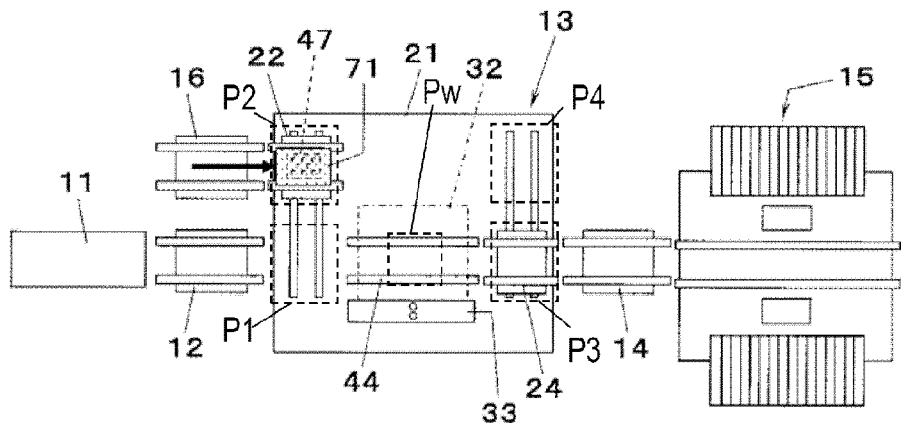
FIGS. 11A to 11C are views illustrating operations when installation work of the undersupporting device is performed by the assembly board manufacturing system in the embodiment.
Figure 11B:
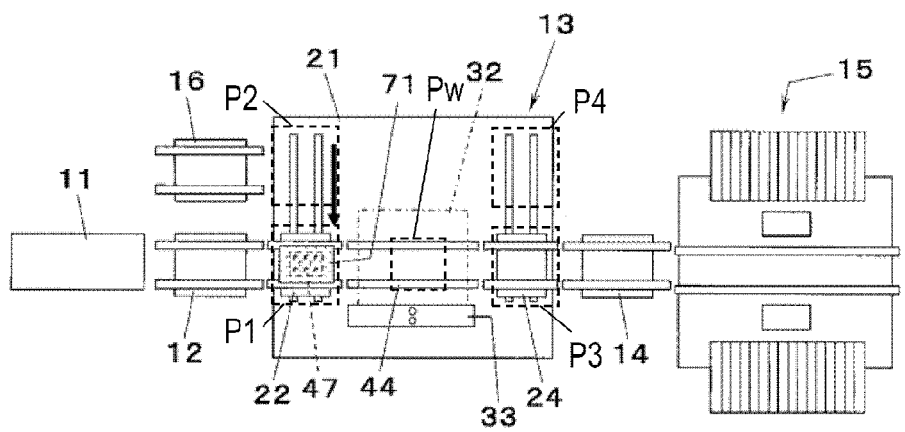
Figure 11C:
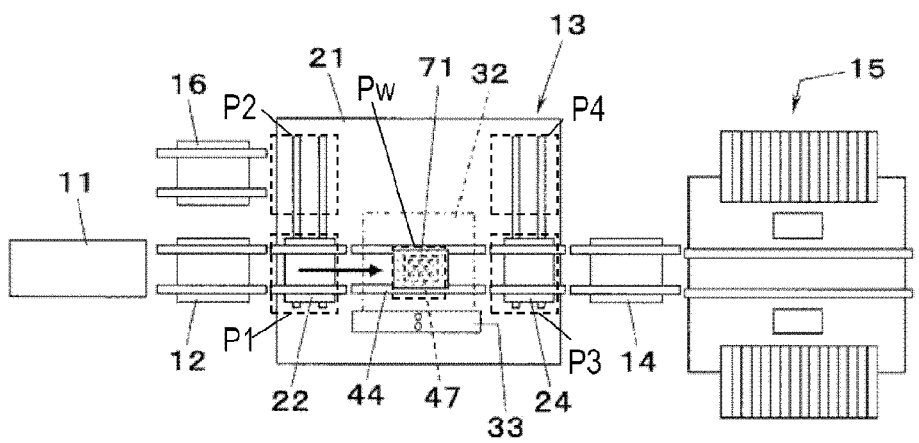

As described above, carrier 71 which holds undersupporting device 47 is set in undersupporting-device stocker 16 in advance, and undersupporting-device stocker 16 supplies undersupporting device 47 which serves as the transport target to receiving position P2 (undersupporting device supplying process). Specifically, after positioning carry-in side delivering unit 22 at receiving position P2 in advance, carrier 71 which holds undersupporting device 47 is carried out to carry-in side delivering unit 22 from undersupporting-device stocker 16 (FIG. 11A). Carry-in side delivering unit 22 which receives carrier 71 that holds undersupporting device 47 from undersupporting-device stocker 16, moves to receiving position P1 from receiving position P2 (FIG. 11B). In addition, carry-in side delivering unit 22 delivers carrier 71 to transporter 44, and transporter 44 transports received carrier 71 to working position Pw (FIG. 11C). In other words, undersupporting device 47 supplied from receiving position P2 is transported to working position Pw by carry-in side delivering unit 22 and transporter 44 (undersupporting device transporting process).

Figure 12A:
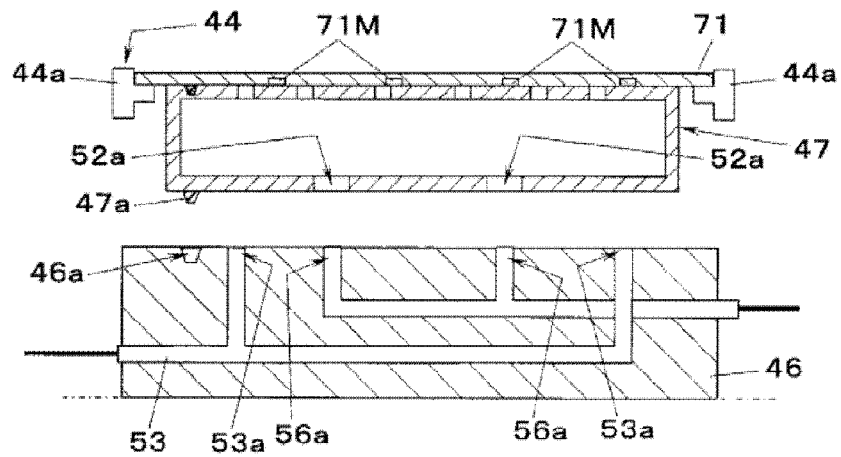
FIGS. 12A to 12C are views illustrating operations when the installation work of the undersupporting device is performed by the assembly board manufacturing system in the embodiment.
Figure 12B:
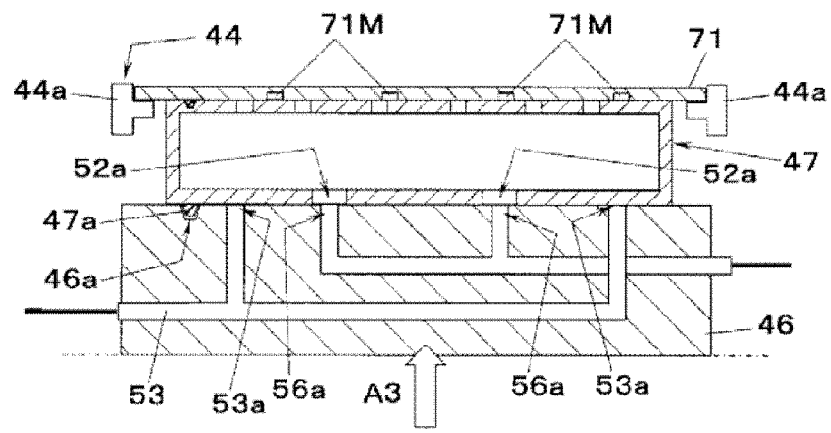
Figure 12C:
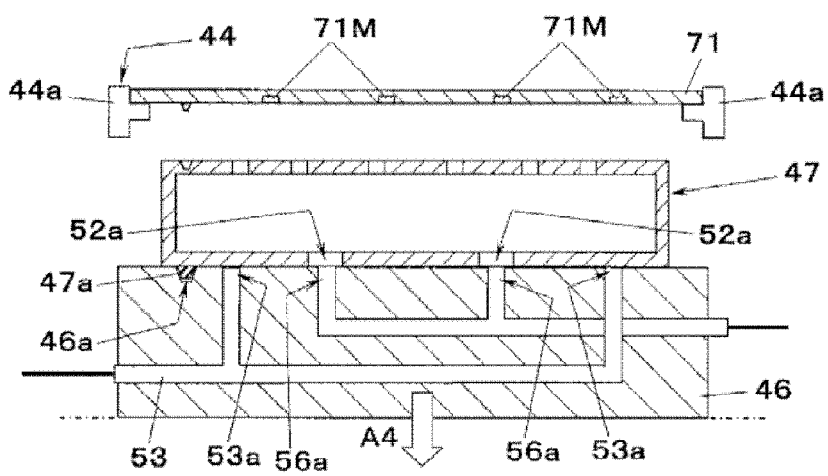

As transporter 44 transports carrier 71 to working position Pw, when undersupporting device 47 held by carrier 71 is positioned above undersupporting-device installer 46 (FIG. 12A), undersupporting device 47 positioned above undersupporting-device installer 46 is installed on undersupporting-device installer 46 (undersupporting device installing process). Specifically, first, as elevator mechanism 48 raises undersupporting-device installer 46 (arrow A3 illustrated in FIG. 12B). Accordingly, when the upper surface of undersupporting-device installer 46 comes into contact with the bottom surface of undersupporting device 47 held by carrier 71, and projection 47a is fitted to recess 46a (FIG. 12B), control device 60 operates control valve 54, and generates the vacuum-suctioning force to vacuum suction opening 53a. When undersupporting device 47 is fixed to the upper surface of undersupporting-device installer 46 by the vacuum-suctioning force generated to vacuum suction opening 53a, elevator mechanism 48 lowers undersupporting-device installer 46 (arrow A4 illustrated in FIG. 12C). Accordingly, undersupporting device 47 is separated from carrier 71, and is placed in a state of being installed on undersupporting-device installer 46 (FIG. 12C).

Figure 13A:
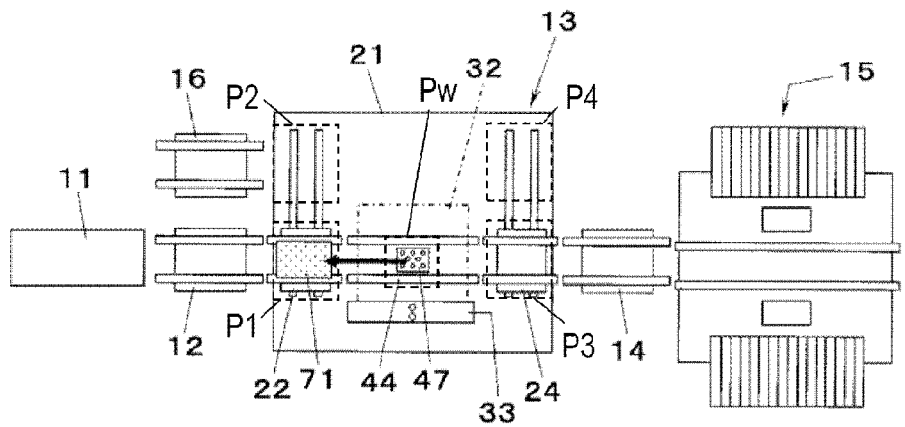
FIGS. 13A to 13C are views illustrating operations when the installation work of the undersupporting device is performed by the assembly board manufacturing system in the embodiment.
Figure 13B:
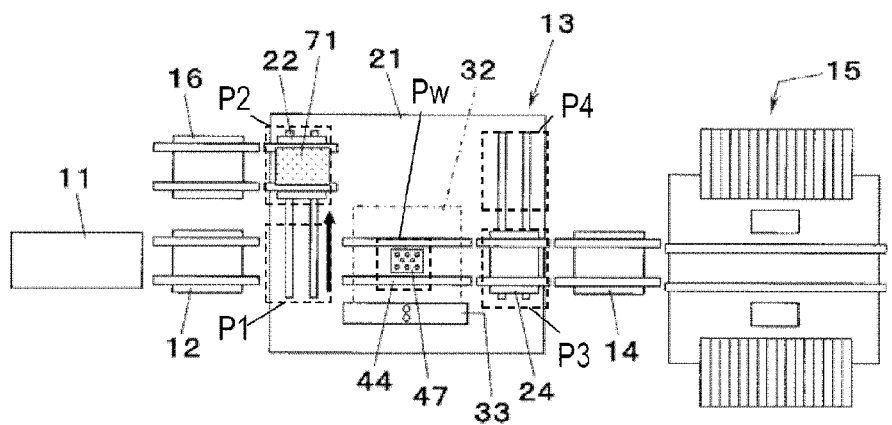
Figure 13C:
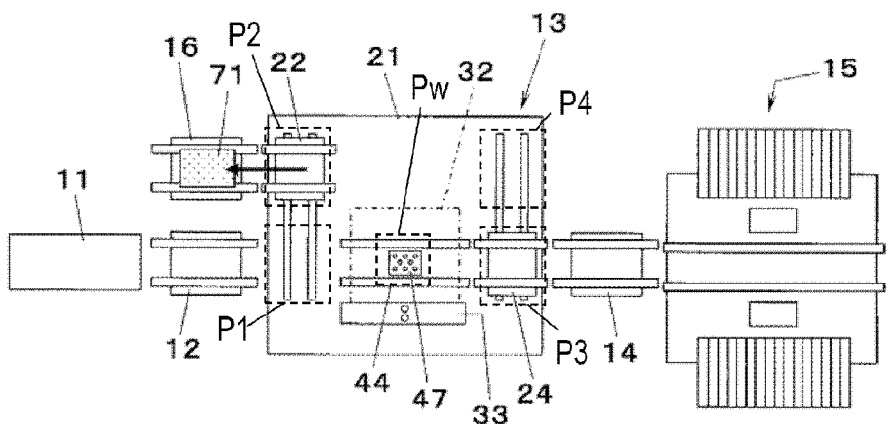

As described above, when undersupporting device 47 is installed on undersupporting-device installer 46, transporter 44 transports carrier 71 separated from undersupporting device 47 to a transporter inlet side, and delivers carrier 71 to carry-in side delivering unit 22 which is positioned at the transporter inlet (receiving position P1) in advance (FIG. 13A). In addition, carry-in side delivering unit 22 which has received carrier 71 moves to receiving position P2 from receiving position P1 (FIG. 13B), and carries out carrier 71 to undersupporting-device stocker 16. Undersupporting-device stocker 16 receives and collects carrier 71 (FIG. 13C). Accordingly, the installation of undersupporting device 47 on screen printing device 13 is completed.

Figure 14A:
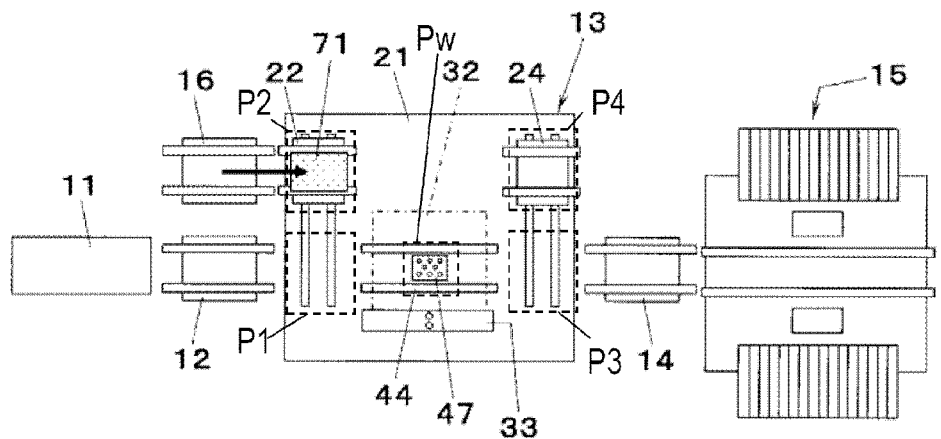
FIGS. 14A to 14C are views illustrating operations when collection work of the undersupporting device is performed by the assembly board manufacturing system in the embodiment.
Figure 14B:
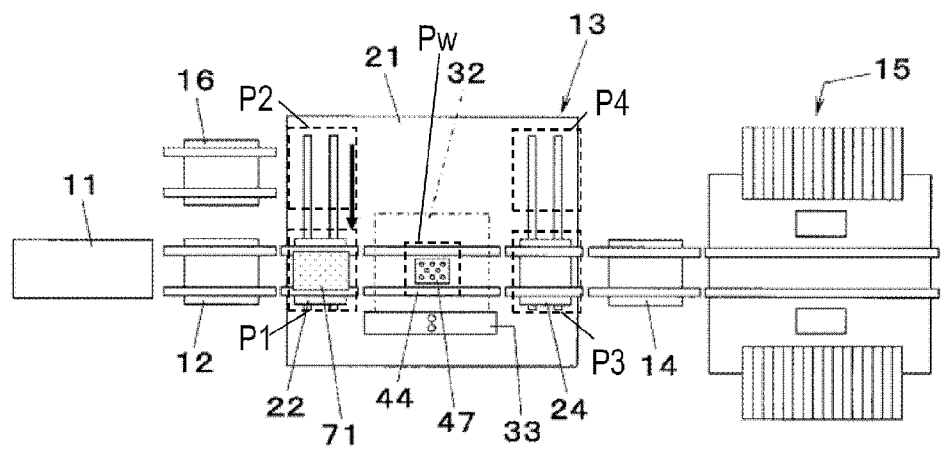
Figure 14C:
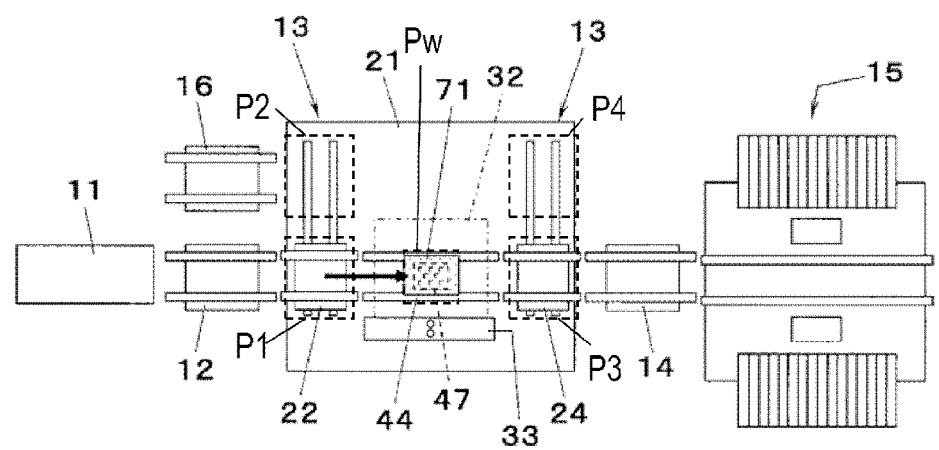

Next, an order of a case where undersupporting device 47 installed on screen printing device 13 is automatically collected, will be described. In undersupporting-device stocker 16, single carrier 71 which does not hold undersupporting device 47 is accommodated in undersupporting-device stocker 16 in advance, carry-in side delivering unit 22 is positioned at receiving position P2 in advance, and additionally, single (undersupporting device 47 is not held) carrier 71 is carried out from undersupporting-device stocker 16 (FIG. 14A). Carry-in side delivering unit 22 which has received single carrier 71 from undersupporting-device stocker 16 moves from receiving position P2 to receiving position P1 (FIG. 14B). In addition, carry-in side delivering unit 22 delivers carrier 71 to transporter 44, and transporter 44 transports received carrier 71 to working position Pw (FIG. 14C).

Figure 15A:
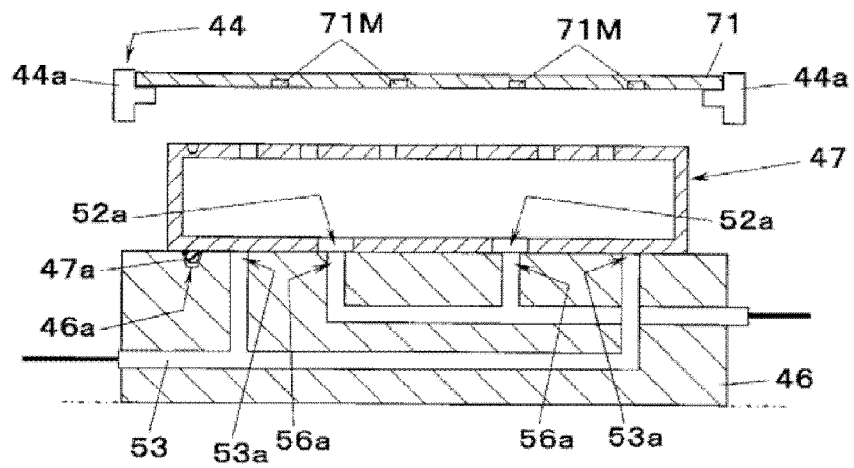
FIGS. 15A to 15C are views illustrating operations when collection work of the undersupporting device is performed by the assembly board manufacturing system in the embodiment.
Figure 15B:
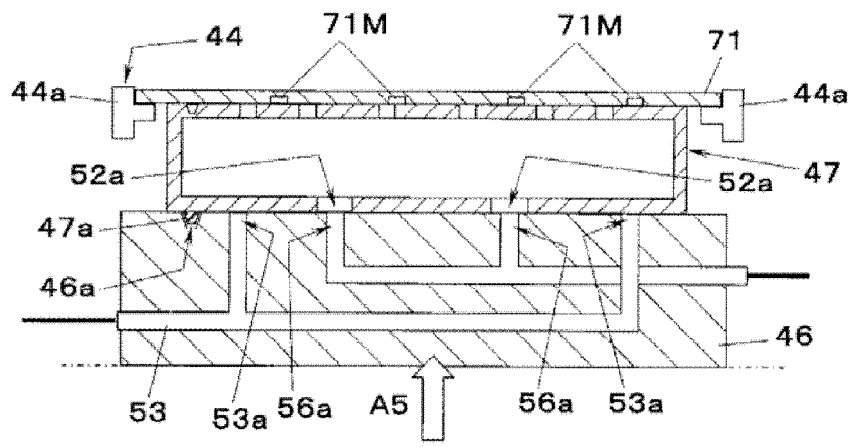
Figure 15C:
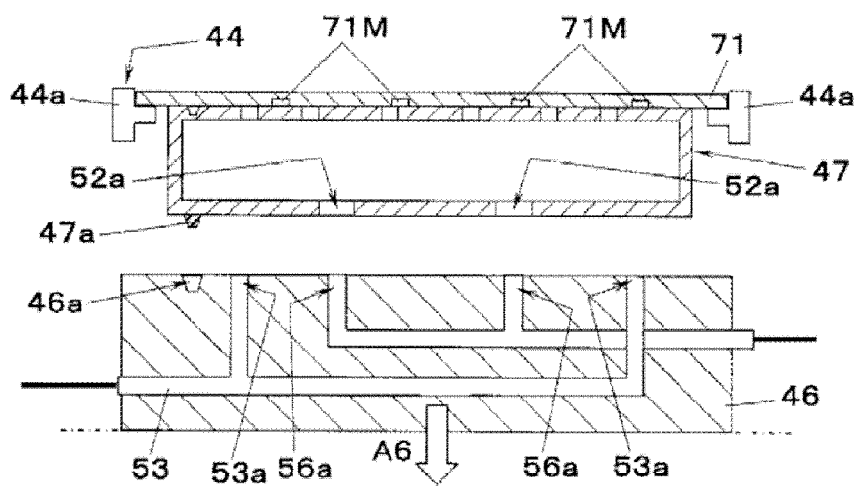

As transporter 44 transports single carrier 71 to working position Pw, when single carrier 71 is positioned above undersupporting device 47 installed on undersupporting-device installer 46 (FIG. 15A), undersupporting device 47 installed on undersupporting-device installer 46 is detached from undersupporting-device installer 46 and delivered to transporter 44 (undersupporting device detaching process). Specifically, first, elevator mechanism 48 raises undersupporting-device installer 46 (arrow A5 illustrated in FIG. 15B). Accordingly, when the upper surface of undersupporting device 47 comes into contact with the lower surface of carrier 71, and undersupporting device 47 is held by carrier 71 by the magnetic force (pulling force) between undersupporting device 47 and carrier 71 (FIG. 15B), control device 60 operates control valve 54 and opens vacuum suction piping 53 to the atmosphere, and in a state where the vacuum-suctioned state of undersupporting device 47 is released, elevator mechanism 48 lowers undersupporting-device installer 46 (arrow A6 illustrated in FIG. 15C). Accordingly, undersupporting device 47 is separated from undersupporting-device installer 46, and is placed in a state of being delivered to carrier 71 (FIG. 15C).

Figure 16A:
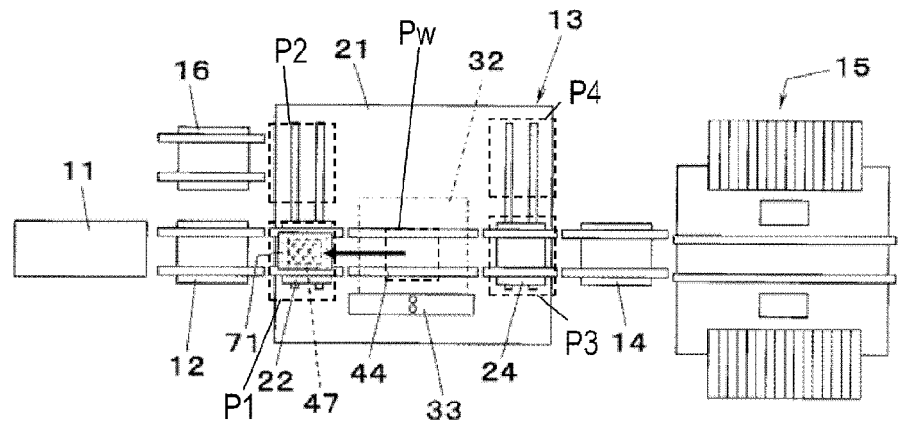
FIGS. 16A to 16C are views illustrating operations when the collection work of the undersupporting device is performed by the assembly board manufacturing system in the embodiment.
Figure 16B:
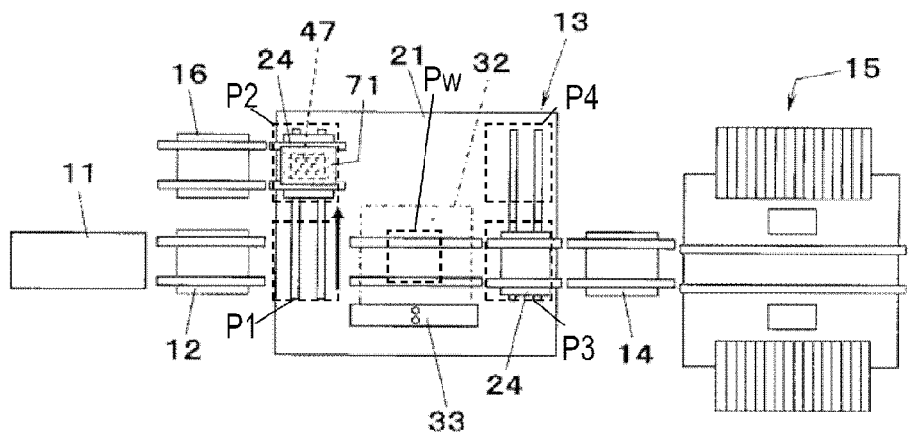
Figure 16C:
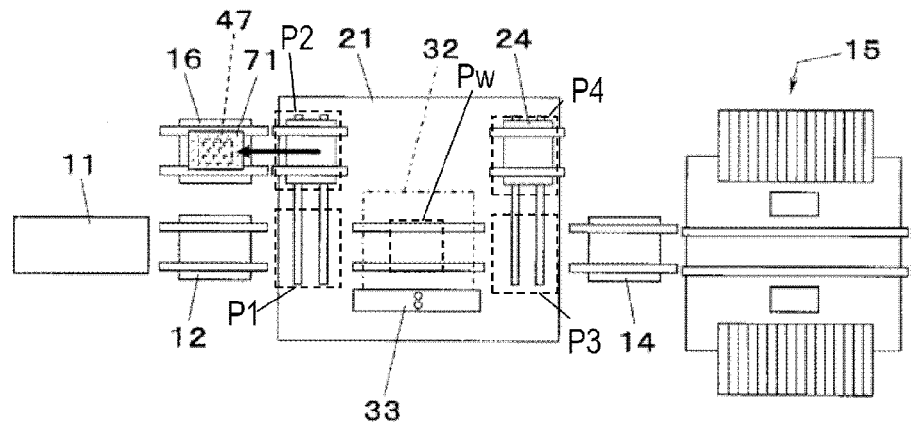

In this manner, when undersupporting device 47 is delivered to carrier 71, transporter 44 delivers undersupporting device 47 to carry-in side delivering unit 22 (undersupporting device delivering process). Specifically, transporter 44 transports carrier 71 which holds undersupporting device 47 to the carry-in inlet side, and delivers carrier 71 to carry-in side delivering unit 22 positioned at the transporter inlet (receiving position P1) in advance (FIG. 16A). In addition, carry-in side delivering unit 22 carries out undersupporting device 47 received from transporter 44, from receiving position P2 (undersupporting device carrying-out process). Specifically, carry-in side delivering unit 22 which has received carrier 71 that holds undersupporting device 47 moves from receiving position P1 to receiving position P2 (FIG. 16B), and additionally, carrier 71 is carried out to undersupporting-device stocker 16. In addition, undersupporting-device stocker 16 receives and collects undersupporting device 47 together with carrier 71 (FIG. 16C). Accordingly, the collection of undersupporting device 47 from screen printing device 13 is completed.

In this manner, in the embodiment, transporter 44 delivers undersupporting device 47 detached from undersupporting-device installer 46 to carry-in side delivering unit 22, and carry-in side delivering unit 22 carries out undersupporting device 47 received from transporter 44, from receiving position P2.

In addition, in the embodiment, undersupporting device 47 is supplied to receiving position P2 in a state of being held on the board-like lower surface of carrier 71, and as carrier 71 is transported by carry-in side delivering unit 22 and transporter 44, carrier 71 is transported to working position Pw, and is installed on undersupporting-device installer 46. Undersupporting device 47 detached from undersupporting-device installer 46 is held on the lower surface of carrier 71 positioned at working position Pw, and as carrier 71 is transported by transporter 44 and carry-in side delivering unit 22, carrier 71 is carried out from receiving position P2.

According to the above-described order, it is possible to install undersupporting device 47 to screen printing device 13, and to collect undersupporting device 47 from screen printing device 13. However, after collecting undersupporting device 47, by continuously performing the installation work of undersupporting device 47, it is possible to automatically perform exchange work of undersupporting device 47 in the middle of producing the assembly boards.

As described above, in assembly board manufacturing system 1 (the installation method of the undersupporting device in assembly board manufacturing system 1) according to the embodiment, in a case where the transport target is board 2, carry-in side delivering unit 22 receives board 2 at receiving position P1 and delivers board 2 to transporter 44, and in a case where the transport target is undersupporting device 47, carry-in side delivering unit 22 receives the undersupporting device 47 at receiving position P2 different from receiving position P1, and delivers the undersupporting device 47 to transporter 44. Therefore, when installing undersupporting device 47, it is possible to supply undersupporting device 47 by a path different from board 2, and it is not necessary to stop (interrupt) the supply of board 2 from board supplier 11. Therefore, it is possible to perform the automatic installation of undersupporting device 47 without interruption of the supply of board 2 by board supplier 11.

In addition, in the above-described embodiment, regarding undersupporting device 47, undersupporting device 47 is installed on undersupporting-device installer 46 by vacuum suction mechanism 55 which vacuum-suctions undersupporting device 47 to the undersupporting-device installer 46 side, but undersupporting device 47 may be installed on undersupporting-device installer 46 by means, other than the vacuum-suctioning. In addition, undersupporting device 47 is held on the lower surface of carrier 71 by the magnetic force between undersupporting device 47 and carrier 71, but undersupporting device 47 may be held by carrier 71 by means, other than the magnetic force.

In addition, in the above-described embodiment, a processing content with respect to board 2 is the screen printing work of printing paste Pst on board 2 by screen printing device 13, but may be another work, for example, component mounting work of mounting the components on board 2 by component placement device 15. In a case where the processing content with respect to board 2 is the component mounting work, board transport path 61 provided in component placement device 15 illustrated in the above-described embodiment may be replaced with transporter 44, board support unit 62 may be replaced with undersupporting device 47, and screen printing device 13 may be replaced with board supplier 11 in the above-described embodiment, and then, component placement device 15 may be configured to include carry-in side delivering unit 22.

As described above, transporter 44 is configured to transport board 2 and undersupporting device 47. Undersupporting-device installer 46 is provided below the transporter 44, and is attachable to and detachable from undersupporting device 47. Board processor (32, 33) is configured to perform a predetermined processing to an upper surface of board 2. Carry-in side delivering unit 22 has first receiving position P1 and second receiving position P2 different from first receiving position P1. Board supplier 11 is configured to supply board 2 to first receiving position P1. Undersupporting-device supplier (16) is configured to supply undersupporting device 47 to second receiving position P2. Carry-in side delivering unit 22 delivers, to transporter 44, undersupporting device 47 supplied to second receiving position P2. Transporter 44 transports, to working position Pw, undersupporting device 47 delivered from carry-in side delivering unit 22. Undersupporting-device installer 46 fixes, to undersupporting-device installer 46, undersupporting device 47 transported to working position Pw. Carry-in side delivering unit 22 delivers, to transporter 44, board 2 supplied to first receiving position P1. Transporter 44 transports, to working position Pw, board 2 delivered from carry-in side delivering unit 22. Undersupporting device 47 supports a lower surface of board 2 transported to working position Pw. Board processor (32, 33) performs the predetermined processing to the upper surface of board 2 while undersupporting device 47 is installed to undersupporting-device installer 46 and undersupporting device 47 supports the lower surface of board 2. Transporter 44 transports, to carry-in side delivering unit 22, undersupporting device 47 detached from undersupporting-device installer 46. Carry-in side delivering unit 22 positions, at second receiving position P2, undersupporting device 47 delivered from transporter 44 to allow undersupporting device 47 to be carried out from second receiving position P2.

The system may further include carrier 71 which configured to hold undersupporting device 47. In this case, undersupporting-device supplier (16) supplies carrier 71 to second receiving position P2 while carrier 71 holds undersupporting device 47 on a lower surface of carrier 71. Carry-in side delivering unit 22 delivers, to transporter 44, carrier 71 supplied to second receiving position P2 while undersupporting device 47 is held on the lower surface of carrier 71. Transporter 44 transports undersupporting device 47 to working position Pw by transporting, to working position Pw, carrier 71 delivered from carry-in side delivering unit 22 while undersupporting device 47 is held on the lower surface of carrier 71. Undersupporting device 47 transported to working position Pw is installed to undersupporting-device installer 46. Transporter 44 positions carrier 71 at working position Pw. Undersupporting device 47 detached from undersupporting-device installer 46 is held on the lower surface of carrier 71 positioned at working position Pw. Transporter 44 delivers the carrier 71 to carry-in side delivering unit 22 while undersupporting device 47 detached from undersupporting-device installer 46 is held on the lower surface of carrier 71. Carry-in side delivering unit 22 positions, at second receiving position P2, carrier 71 delivered from transporter 44 to allow undersupporting device 47 to be carried out from second receiving position P2 while undersupporting device 47 is held on the lower surface of carrier 71.

The system may further include elevator mechanism 48 configured to raise and lower undersupporting-device installer 46. In this case, elevator mechanism 48 is configured to fix undersupporting device 47 held by carrier 71 to undersupporting-device installer 46 by raising undersupporting-device installer 46. Elevator mechanism 48 is configured to install undersupporting device 47 to undersupporting-device installer 46 by lowering undersupporting-device installer 46 while undersupporting device 47 is fixed to undersupporting-device installer 46.

Elevator mechanism 48 is configured to cause carrier 71 to hold undersupporting device 47 installed to undersupporting-device installer 46 by raising undersupporting-device installer 46. Elevator mechanism 48 is configured to detach undersupporting device 47 from undersupporting-device installer 46 by lowering undersupporting-device installer 46 while undersupporting device 47 is held by carrier 71.

The system may further include vacuum suction mechanism 55 configured to vacuum-suction undersupporting device 47 toward undersupporting-device installer 46. In this case, vacuum suction mechanism 55 vacuum-suctions the lower surface of undersupporting device 47 after elevator mechanism 48 raises undersupporting-device installer 46 and causes undersupporting-device installer 46 to contact undersupporting device 47. Elevator mechanism 48 installs undersupporting device 47 to undersupporting-device installer 46 by lowering undersupporting-device installer 46 while vacuum suction mechanism 55 vacuum-suctions the lower surface of undersupporting device 47.

Elevator mechanism 48 raises the undersupporting-device installer 46 as to cause carrier 71 to hold undersupporting-device installer 46. Vacuum suction mechanism 55 releases a vacuum-suctioning of the lower surface of undersupporting device 47 while undersupporting-device installer 46 is held by carrier 71. Elevator mechanism 48 detaches undersupporting device 47 from undersupporting-device installer 46 by lowering undersupporting-device installer 46 while vacuum suction mechanism 55 releases the vacuum-suctioniong of to the lower surface of undersupporting device 47.

Undersupporting device 47 may be held on the lower surface of carrier 71 by a magnetic force.

Undersupporting device 47 may suction the lower surface of board 2 positioned at working position Pw by transporter 44 while supporting the lower surface of board 2.

One of undersupporting device 47 and undersupporting-device installer 46 may have projection 47a. In this case, another of undersupporting device 47 and undersupporting-device installer 46 has recess 46a provided therein. Undersupporting device 47 is installed to undersupporting-device installer 46 while projection 47a is fitted to recess 46a.

Undersupporting device 47 is supplied to second receiving position P2. Undersupporting device 47 supplied to second receiving position P2 by carry-in side delivering unit 22 and transporter 44 is transported to working position Pw. Undersupporting device 47 detached from undersupporting-device installer 46 is delivered to carry-in side delivering unit 22 by transporter 44. Undersupporting device 47 delivered from transporter 44 is carried out from second receiving position P2 of carry-in side delivering unit 22. The above method allows undersupporting device 47 to be installed to a system for manufacturing an assembly board.

What is claimed is:

1. A system for manufacturing an assembly board, the system comprising:
an undersupporting device comprising a hollow box with a top board having an upper surface with at least one suction hole therein;
a carrier configured to hold the undersupporting device; a transporter having a pair of conveyors, the transporter configured to transport a board and the undersupporting device;
an undersupporting-device installer provided below the transporter, the undersupporting-device installer having an upper surface with at least one vacuum suction opening that is attachable to and detachable from a bottom surface of the undersupporting device;
a board processor configured to perform a predetermined processing to an upper surface of the board;
a first receiving position and a second receiving position different from the first receiving position, wherein the board is supplied to the first receiving position, and wherein the undersupporting device is supplied to and carried out from the second receiving position;
a working position at which the board processor performs the predetermined processing to the upper surface of the board,
wherein the transporter is configured to deliver the board and the undersupporting device to the working position, wherein the undersupporting device is delivered to the working position by transporting the carrier while the carrier holds the undersupporting device on a lower surface of the carrier
wherein when the board and the undersupporting device are positioned at the working position, the upper surface of the undersupporting device supports a lower surface of the board
the board processor performs the predetermined processing to the upper surface of the board, and the undersupporting device is fixed to the undersupporting-device installer.

2. The system of claim 1, further comprising:
an elevator mechanism coupled to the undersupporting-device installer to raise and lower the undersupporting-device installer.

3. The system of claim 2, wherein the elevator mechanism:
raises the undersupporting-device installer to attach the undersupporting device to the carrier; and
lowers the undersupporting-device installer to detach the undersupporting device from the carrier.

4. The system of claim 1, further comprising:
a vacuum suction mechanism configured to vacuum-suction the undersupporting device toward the undersupporting-device installer.

5. The system of claim 4,
wherein the vacuum suction mechanism releases a vacuum-suctioning of the lower surface of the undersupporting device while the undersupporting-device is held by the carrier, and
wherein an elevator mechanism detaches the undersupporting device from the undersupporting-device installer by lowering the undersupporting-device installer while the vacuum suction mechanism releases the vacuum-suctioning of the lower surface of the undersupporting device.

6. The system of claim 1, wherein the undersupporting device is held on the lower surface of the carrier by a magnetic force.

7. The system of claim 1, wherein the undersupporting device is secured to the lower surface of the board by suction force when positioned at the working position.

8. The system of claim 1,
wherein one of the undersupporting device and the undersupporting-device installer has a projection, wherein another of the undersupporting device and the undersupporting-device installer has a recess provided therein, and wherein the undersupporting device is installed to the undersupporting-device installer while the projection is fitted to the recess.

9. The system of claim 1, wherein the undersupporting device is detached from the undersupporting-device installer when positioned at the second receiving position.

10. A method of installing an undersupporting device to a system for manufacturing an assembly board, comprising:
providing a system for manufacturing an assembly board, the system including
an undersupporting device comprising a hollow box with a top board,
a carrier configured to hold the undersupporting device;
a transporter configured to transport a board and the undersupporting device,
an undersupporting-device installer provided below the transporter, the undersupporting-device installer being attachable to and detachable from the undersupporting device,
a base having a first receiving position and a second receiving position different from the first receiving position, and
a board processor configured to perform a predetermined processing to an upper surface of the board while the undersupporting device is fixed to the undersupporting-device installer and the undersupporting device supports a lower surface of the board;
supplying the board to the first receiving position;
supplying the undersupporting device to the second receiving position;
transporting, to a working position, the undersupporting device supplied to the second receiving position by transporting the carrier while the carrier holds the undersupporting device on a lower surface of the carrier;
delivering the undersupporting device detached from the undersupporting-device installer to the second receiving position; and
carrying out, from the second receiving position of the base, the undersupporting device.

11. A system for manufacturing an assembly board, the system comprising:
a base comprising a first receiving position, a second receiving position, a working position, and a carry-out position;
a board supplied to the base at the first receiving position;
an undersupporting device comprising a hollow box with a top board having an upper surface with at least one suction hole for supporting the board, the undersupporting device supplied to the base at the second receiving position, the first receiving position being different from the second receiving position; and a carrier configured to hold the undersupporting device;
wherein the system is configured such that: the board is transported between the first receiving position, the working position, and the carry-out position,
wherein the undersupporting device is transported between the second receiving position and the working position by transporting the carrier while the carrier holds the undersupporting device on a lower surface of the carrier.

12. The system of claim 11, wherein the undersupporting device has at least one piping connection hole at a lower surface of the undersupporting device.

13. The system of claim 12, further comprising an undersupporting-device installer positioned at the working position, the undersupporting-device installer having suction piping therein, wherein when the undersupporting device is positioned at the working position, an upper surface of the undersupporting-device installer is coupled to a lower surface of the undersupporting device such that the suction piping is in fluid communication with the at least one piping connection hole.

14. The system of claim 11, wherein the undersupporting device can be carried out from the base from the second receiving position.

* * * * *